(12) United States Patent
Tatsumi

(10) Patent No.: US 10,591,532 B2
(45) Date of Patent: Mar. 17, 2020

(54) SEMICONDUCTOR INTEGRATED CIRCUIT

(71) Applicant: Sony Semiconductor Solutions Corporation, Kanagawa (JP)

(72) Inventor: Takaaki Tatsumi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 291 days.

(21) Appl. No.: 15/516,566

(22) PCT Filed: Oct. 28, 2015

(86) PCT No.: PCT/JP2015/080357
§ 371 (c)(1),
(2) Date: Apr. 3, 2017

(87) PCT Pub. No.: WO2016/088482
PCT Pub. Date: Jun. 9, 2016

(65) Prior Publication Data
US 2018/0024187 A1    Jan. 25, 2018

(30) Foreign Application Priority Data

Dec. 5, 2014    (JP) ................................. 2014-247067

(51) Int. Cl.
*G01R 31/00* (2006.01)
*G01R 31/28* (2006.01)
(Continued)

(52) U.S. Cl.
CPC ....... *G01R 31/2853* (2013.01); *G01R 31/085* (2013.01); *G01R 31/1236* (2013.01);
(Continued)

(58) Field of Classification Search
CPC .............. G01R 31/2853; G01R 31/085; G01R 31/1236; G01R 31/002; H01L 21/822;
(Continued)

(56) References Cited

U.S. PATENT DOCUMENTS 8,089,739 B2 *    1/2012    Bhattacharya ...... H01L 27/0266
361/111

FOREIGN PATENT DOCUMENTS

JP    2005-093497 A    4/2005
JP    2010-004021 A    1/2010
(Continued)

OTHER PUBLICATIONS

C. A. Torres et al; "Modular, Portable, and Easily Simulated ESD Protection Networks for Advanced CMOS Technologies", Electrical Overstress/Electrostatic Discharge Symposium, Sep. 11-13. Symposium Proceedings, pp. 81-94.

*Primary Examiner* — Pete T Lee
(74) *Attorney, Agent, or Firm* — Michael Best & Friedrich LLP

(57) ABSTRACT

A semiconductor integrated circuit of the present disclosure includes: first power and second power supply lines that are coupled to a protected circuit; a third power supply line that is supplied with a voltage different from voltages supplied to the first and second power supply lines; a detection circuit that is coupled between the first and second power supply lines and detects a surge occurring in the first power supply line; an inverter circuit that includes one or more inverters coupled in series, and is coupled between the first and second power supply lines; a protection transistor that is coupled between the first and second power supply lines, and is controlled by an output of the detection circuit to cause the surge to flow through the second power supply line; and a time constant circuit that is coupled to at least the third power supply line and the protection transistor.

6 Claims, 5 Drawing Sheets

(51) Int. Cl.
    *H01L 27/04*     (2006.01)
    *H01L 27/06*     (2006.01)
    *H01L 21/822*     (2006.01)
    *H01L 27/02*     (2006.01)
    *G01R 31/08*     (2020.01)
    *G01R 31/12*     (2020.01)

(52) U.S. Cl.
    CPC ........ *H01L 21/822* (2013.01); *H01L 27/0266* (2013.01); *H01L 27/0285* (2013.01); *H01L 27/04* (2013.01); *H01L 27/06* (2013.01); *G01R 31/002* (2013.01)

(58) Field of Classification Search
    CPC . H01L 27/0266; H01L 27/0285; H01L 27/04; H01L 27/06
    See application file for complete search history.

(56) References Cited

FOREIGN PATENT DOCUMENTS

| | | |
|---|---|---|
| JP | 2012-253266 A | 12/2012 |
| JP | 2013-055102 A | 3/2013 |
| JP | 2013-207388 A | 10/2013 |
| JP | 2014-022560 A | 2/2014 |
| JP | 2014-187288 A | 10/2014 |

\* cited by examiner

[ FIG. 1 ]
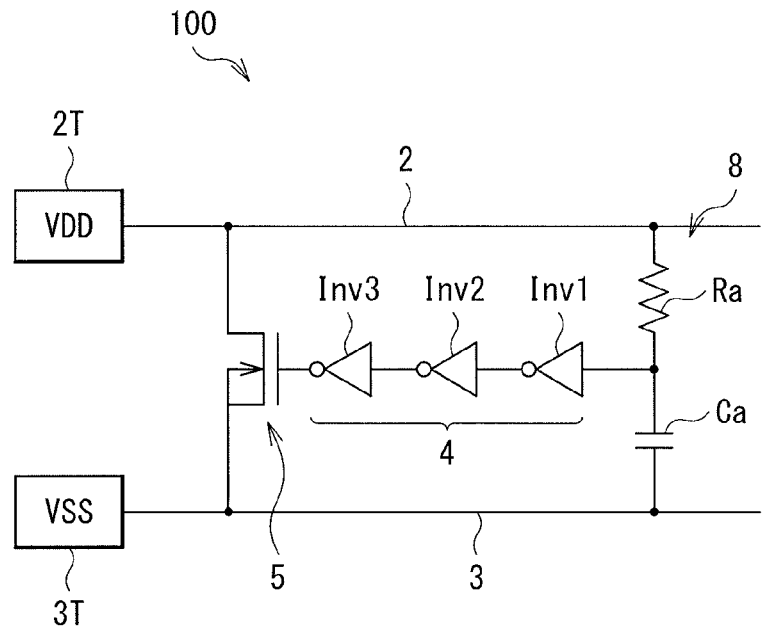
[ FIG. 2 ]
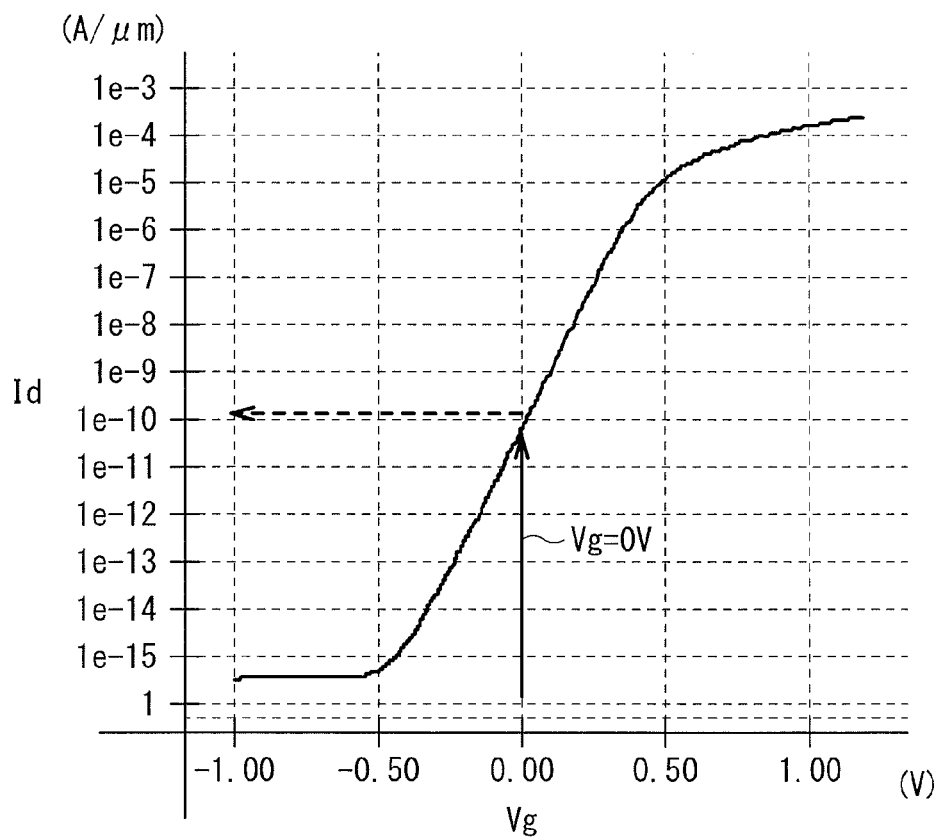

[ FIG. 3 ]
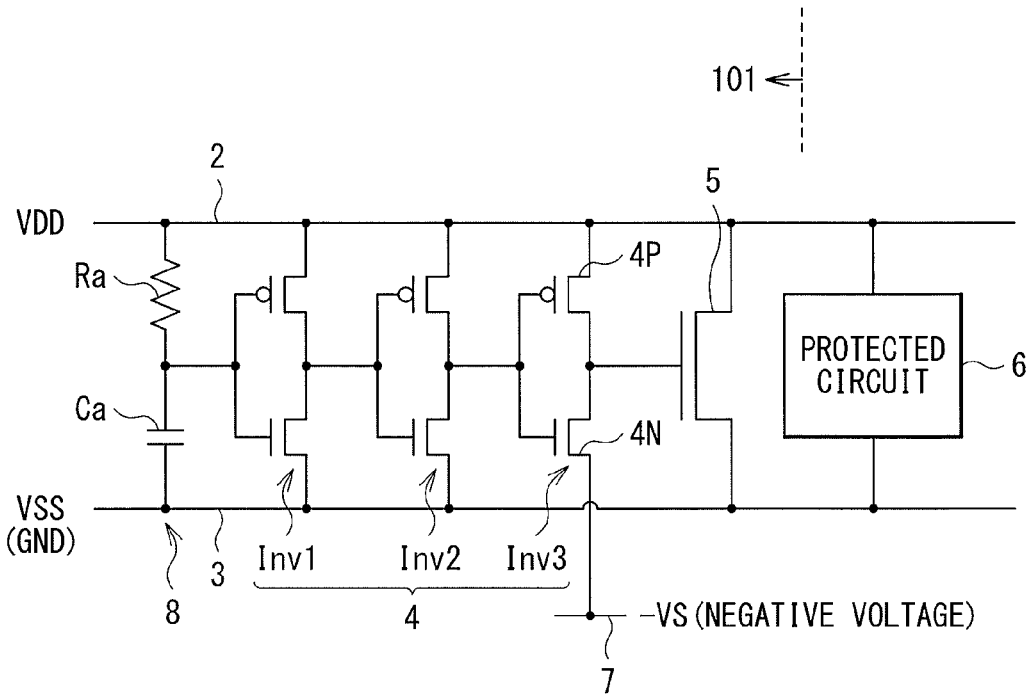
[ FIG. 4 ]
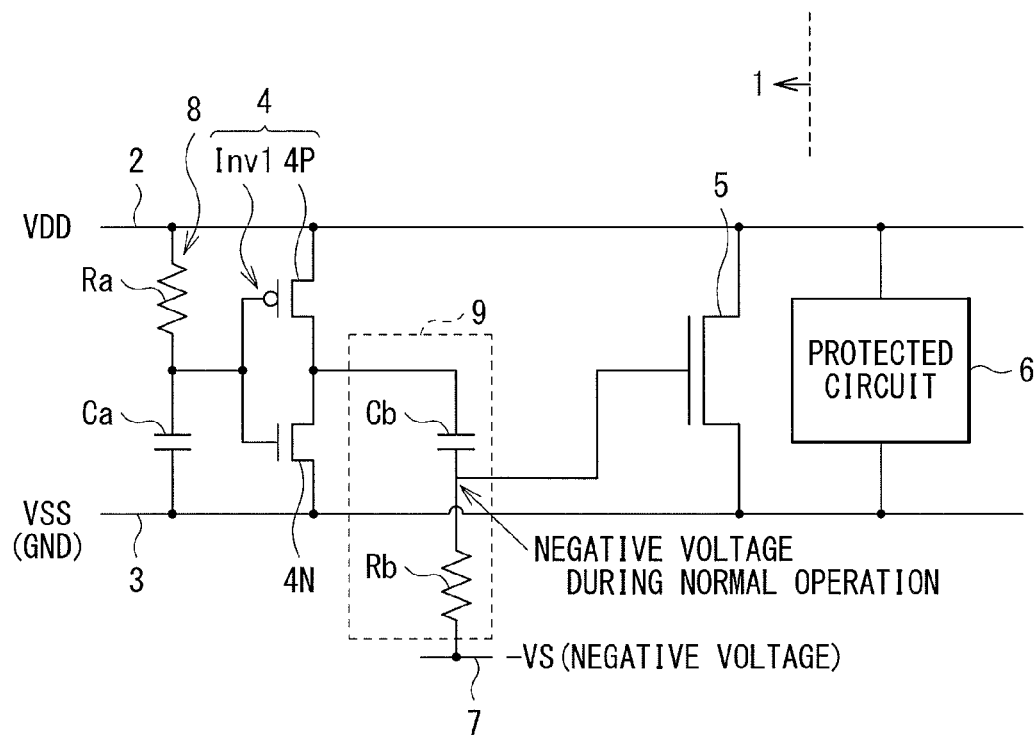

[ FIG. 5 ]
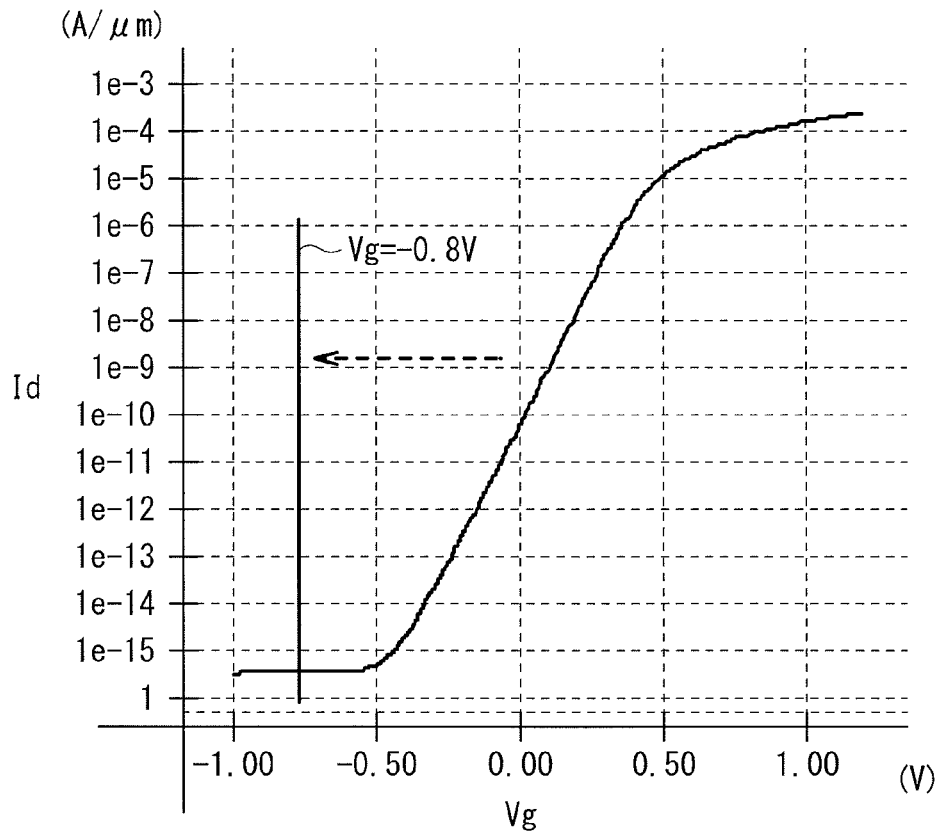
[ FIG. 6 ]
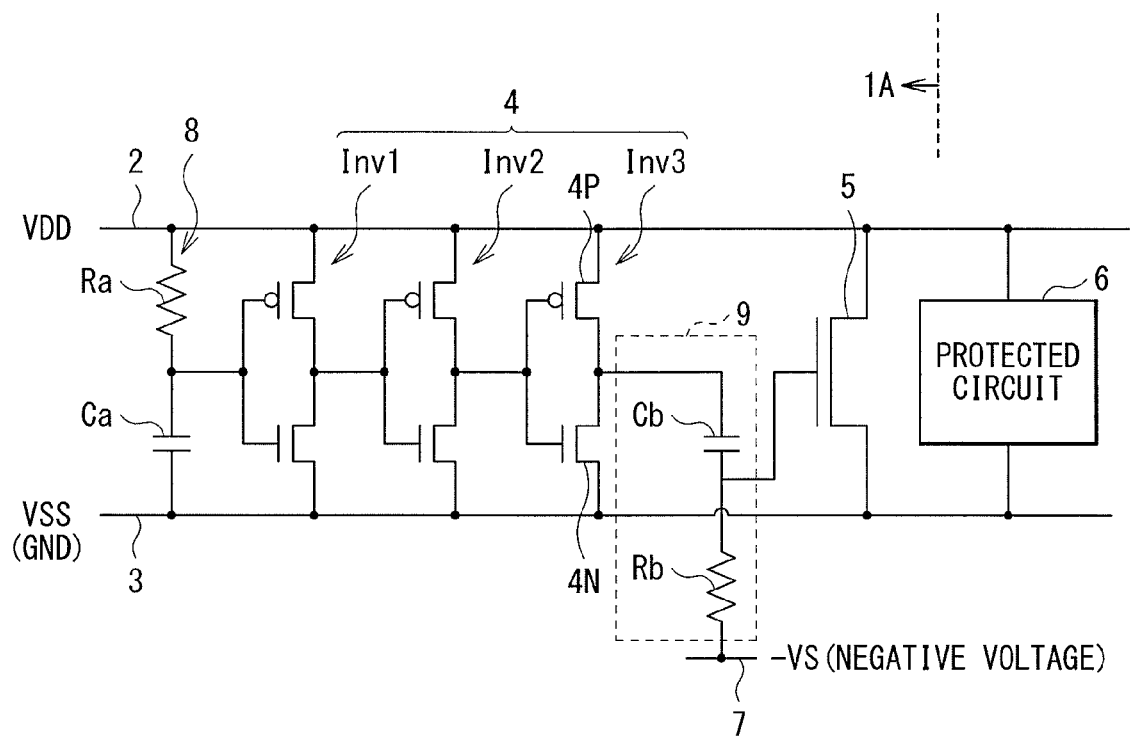

[ FIG. 7 ]
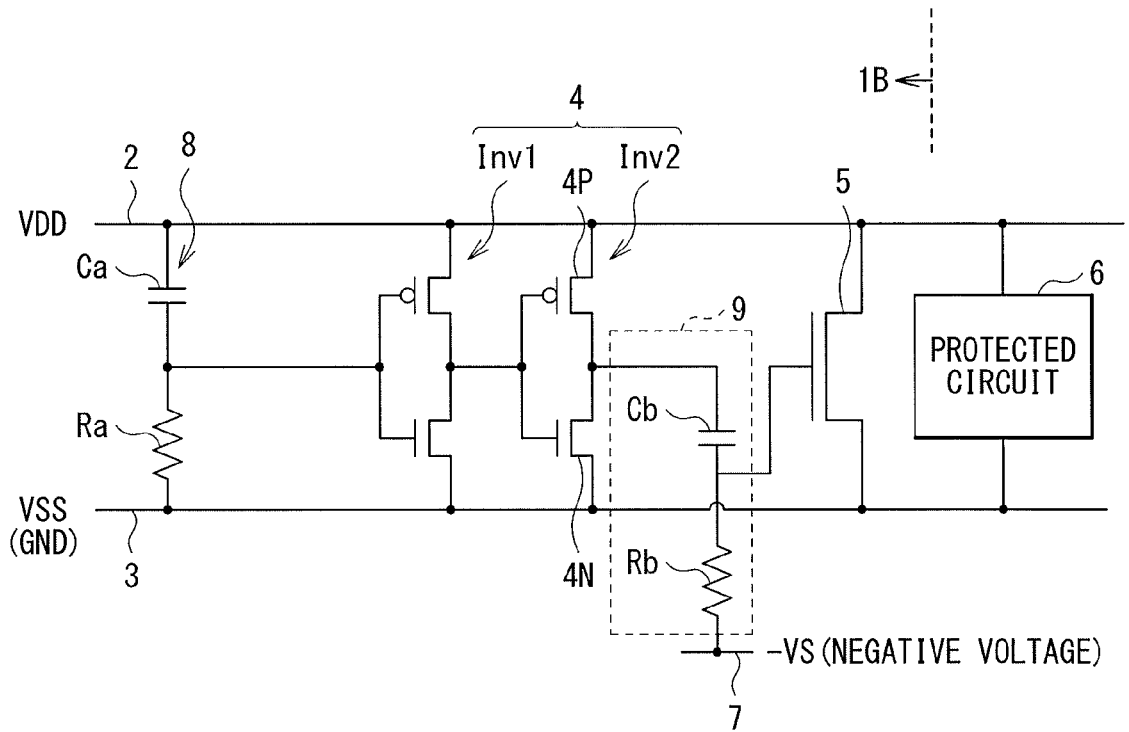
[ FIG. 8 ]
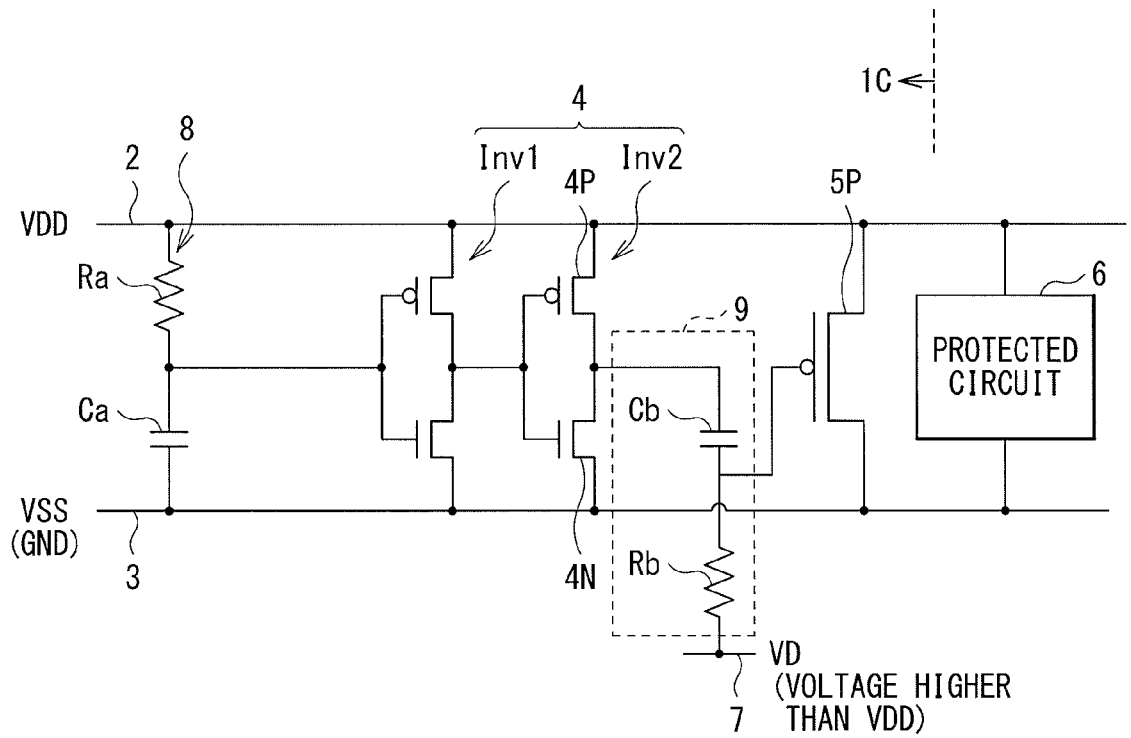

[ FIG. 9 ]
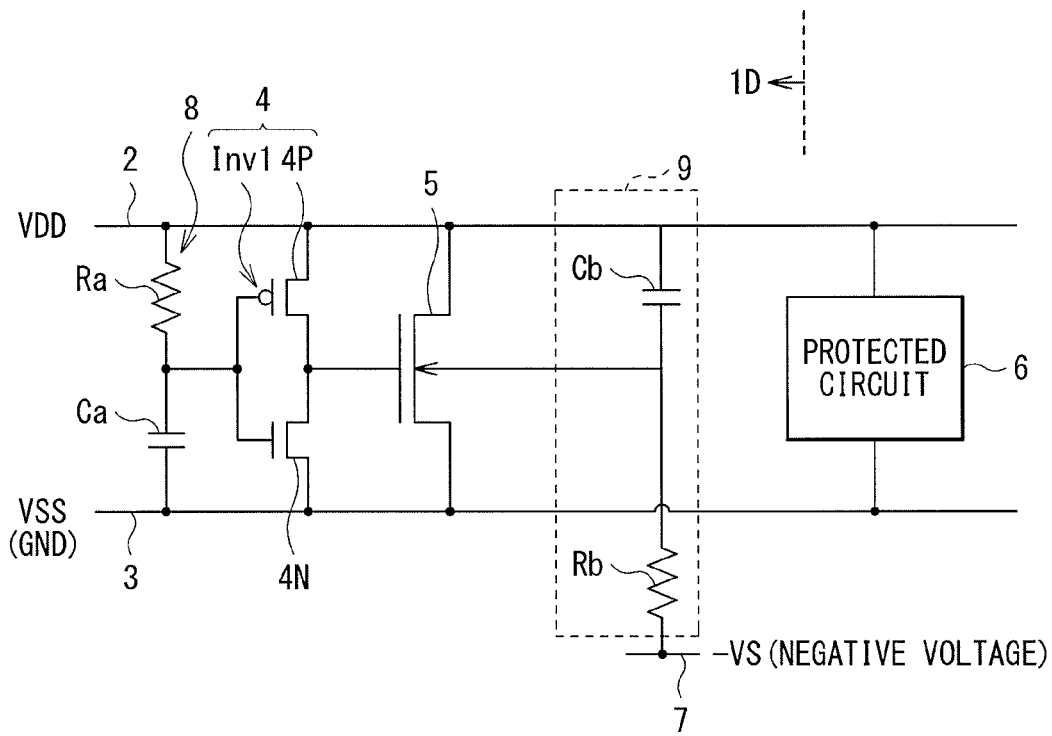
[ FIG. 10 ]
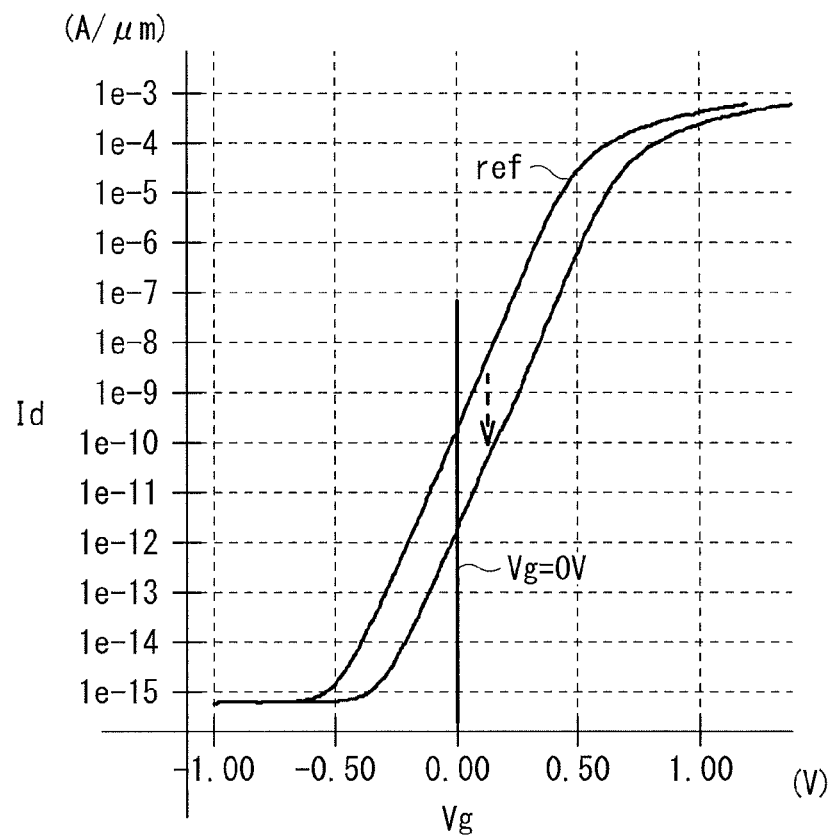

SEMICONDUCTOR INTEGRATED CIRCUIT

TECHNICAL FIELD

The present disclosure relates to a semiconductor integrated circuit including a circuit that removes a surge having occurred in a power supply line.

BACKGROUND ART

A semiconductor integrated circuit such as a large scale integrated circuit (LSI) is typically increased in importance of protecting an internal circuit (hereinafter, referred to as a protected circuit) having a predetermined function from a surge that occurs in a power supply line, in association with miniaturization and voltage reduction of the semiconductor integrated circuit.

The power supply line voltage is drastically increased by electrostatic discharge (ESD) with respect to an external terminal of the power supply line, namely, an ESD surge is well-known as a representative of the surge that occurs in the power supply line.

A device or a circuit for ESD protection is integrated together with the protected circuit on a semiconductor substrate in order to prevent the protected circuit from being damaged by a high-voltage pulse that occurs in the external terminal by the ESD surge.

As the device or circuit for ESD protection, for example, a GGMOS (gate grounded MOS), a thyristor, and an RCMOS are well-known. Although the device or circuit for ESD protection is properly used depending on a purpose, an ESD protection circuit having an RCMOS configuration that is relatively simple in design is often used in recent years (for example, refer to PTL 1 and NPTL 1).

CITATION LIST

Patent Literature

PTL 1: Japanese Unexamined Patent Application Publication No. 2012-253266

Non-Patent Literature

NPTL 1: C. A. Tones et al; "Modular, Portable, and Easily Simulated ESD Protection Networks for Advanced CMOS Technologies", Electrical Overstress/Electrostatic Discharge Symposium, September 11-13. Symposium Proceedings, pp. 81-94, FIG. 1.

SUMMARY OF INVENTION

As the ESD protection circuit having the RCMOS configuration, a configuration in which a detection circuit, an inverter circuit, and a protection transistor are disposed between a power supply wiring and a ground wiring, is well-known. In the configuration, the detection circuit uses a resistor and a capacitor, the inverter circuit uses a CMOS, and the protection transistor transfers a surge occurring in the power supply wiring to the ground wiring. An MOS transistor is used as the protection transistor.

In the ESD protection circuit having the above-described RCMOS configuration, when the surge occurs, the protection transistor is turned on to transfer the surge from the power supply wiring to the ground wiring. When no surge occurs, the protection transistor is turned off and in a standby state. An off-leak current, however, occurs even when the MOS transistor used as the protection transistor is in the off state, and the off-leak current causes an increase of power consumption in the standby state. Therefore, it is desired to reduce the off-leak current.

PTL 1 proposes that, in the ESD protection circuit having the RCMOS configuration, the off-leak current is reduced by coupling one end of an inverter provided in a final stage of the inverter circuit, to a third power supply line that is different from the power supply wiring and the ground wiring. In the circuit described in PTL 1, however, an overcurrent may flow through the inverter that is coupled to the third power supply line, which may cause loss of ESD protection function when a surge occurs.

Therefore, it is desirable to provide a semiconductor integrated circuit that makes it possible to reduce power consumption during normal operation while maintaining the ESD protection function.

A semiconductor integrated circuit according to an embodiment of the present disclosure includes: a first power supply line and a second power supply line that are coupled to a protected circuit; a third power supply line that is supplied with a voltage different from respective voltages supplied to the first power supply line and second power supply line; a detection circuit that is coupled between the first power supply line and the second power supply line and detects a surge occurring in the first power supply line; an inverter circuit that includes one or more inverters coupled in series, and is coupled between the first power supply line and the second power supply line; a protection transistor that is coupled between the first power supply line and the second power supply line, and is controlled by an output of the detection circuit to cause the surge to flow through the second power supply line; and a time constant circuit that is coupled to at least the third power supply line and the protection transistor.

In the semiconductor integrated circuit according to the embodiment of the present disclosure, the time constant circuit is coupled to the third power supply line and the protection transistor, which makes it possible to reduce an off-leak current of the protection transistor.

In the semiconductor integrated circuit according to the embodiment of the present disclosure, the time constant circuit is coupled to the third power supply line and the protection transistor. This makes it possible to reduce the off-leak current of the protection transistor, and to reduce power consumption during the normal operation while maintaining the ESD protection function.

Note that effects described here are non-limiting. Effects achieved by the technology may be one or more of effects described in the present disclosure.

BRIEF DESCRIPTION OF DRAWINGS

FIG. 1 is a circuit diagram illustrating a configuration example of a typical ESD protection circuit.

FIG. 2 is an explanatory diagram illustrating an off-leak current flowing through an NMOS transistor.

FIG. 3 is a circuit diagram illustrating an example of an ESD protection circuit in which the off-leak current is reduced.

FIG. 4 is a circuit diagram illustrating an example of a semiconductor integrated circuit according to a first embodiment of the present disclosure.

FIG. 5 is an explanatory diagram illustrating reduction of the off-leak current by the circuit illustrated in FIG. 4.

FIG. 6 is a circuit diagram illustrating an example of a semiconductor integrated circuit according to a first modification of the first embodiment.

FIG. 7 is a circuit diagram illustrating an example of a semiconductor integrated circuit according to a second modification of the first embodiment.

FIG. 8 is a circuit diagram illustrating an example of a semiconductor integrated circuit according to a third modification of the first embodiment.

FIG. 9 is a circuit diagram illustrating an example of a semiconductor integrated circuit according to a second embodiment.

FIG. 10 is an explanatory diagram illustrating reduction of the off-leak current by the circuit illustrated in FIG. 9.

DESCRIPTION OF EMBODIMENTS

Some embodiments of the present disclosure are described in detail below with reference to drawings. Note that description is given in the following order.
0. Explanation of ESD Protection Circuit (FIG. 1 to FIG. 3)
   0.1 Configuration
      0.1.1 Configuration of First Comparative Example
      0.1.2 Configuration of Second Comparative Example
   0.2 Issues
1. First Embodiment
   1.1 Configuration and Operation (FIG. 4 and FIG. 5)
   1.2 Effects
   1.3 Modifications
      1.3.1 First and Second Modifications (a configuration example in which the number of stages of inverters is set to two or more) (FIG. 6 and FIG. 7)
      1.3.2 Third Modification (a configuration example in which a protection transistor is configured of a PMOS transistor) (FIG. 8)
2. Second Embodiment (FIG. 9 and FIG. 10)
3. Other Embodiments

0. Explanation of ESD Protection Circuit

First, a configuration and issues of an ESD protection circuit that is a comparative example with respect to a semiconductor integrated circuit according to the present disclosure are described.

0.1 Configuration

0.1.1 Configuration of First Comparative Example

FIG. 1 illustrates a circuit of a first comparative example with respect to the semiconductor integrated circuit according to the present disclosure. The circuit of the first comparative example illustrated in FIG. 1 shows a configuration example of an ESD protection circuit 100 having a typical RCMOS configuration based on description of the above-described NPTL 1.

The ESD protection circuit 100 illustrated in FIG. 1 includes: a power supply wiring (a first power supply line) 2 to which an external terminal (a VDD terminal) 2T is coupled; and a reference voltage wiring (a second power line) 3 to which an external terminal (a VSS terminal) 3T is coupled. A power supply voltage VDD is applied between the power supply wiring 2 and the reference voltage wiring 3.

The ESD protection circuit 100 further includes, between the power supply wiring 2 and the reference voltage wiring 3, an inverter circuit 4, a protection transistor 5, and a detection circuit 8.

The protection transistor 5 transfers a high-voltage pulse that is generated in the power supply wiring 2 caused by ESD, to the reference voltage wiring 3. The protection transistor 5 may be configured of, for example, an NMOS transistor, and have a drain terminal that is coupled to the power supply wiring 2 and a source terminal that is coupled to the reference voltage wiring 3.

The detection circuit 8 configures an RC series circuit that includes a detection resistor Ra and a detection capacitor Ca.

The inverter circuit 4 includes one or more inverters each having a CMOS configuration. An example of a three stage configuration in which a first inverter Inv1, a second inverter Inv2, and a third inverter Inv3 are coupled in series is illustrated in FIG. 1. An input end of the inverter circuit 4 is coupled to a node between the detection resistor Ra and the detection capacitor Ca. An output end of the inverter circuit 4 is coupled to a gate terminal of the protection transistor 5.

The ESD protection circuit 100 is so designed as not to react, for example, normal rising and fluctuation of a potential of the power supply wiring 2 with use of a time constant obtained from the detection resistor Ra and the detection capacitor Ca. When the potential of the power supply wiring 2 is intentionally raised as in normal power-on, the rising speed of a pulse thereof is lower than that when an ESD surge occurs. Therefore, a potential VRC of the node that couples the detection resistor Ra to the detection capacitor Ca rises without being delayed from rising of the potential of the power supply wiring 2.

In contrast, when a pulse of a frequency higher than the frequency estimated in the normal operation (for example, an ESD surge) is applied to the power supply wiring 2, the potential VRC of the node that couples the detection resistor Ra to the detection capacitor Ca rises behind rising of the potential of the power supply wiring 2. A potential in a human body model (HBM) that is a representative model of the ESD rises in an extremely short time such as several hundreds of nanoseconds, and the time constant of the detection circuit 8 is determined such that the above-described potential VRC rises by rising of a potential of such a high frequency behind rising of the potential of the power supply wiring 2.

When the potential VRC rises behind rising of the potential of the power supply wiring 2, a positive pulse generated in the inverter circuit 4 is applied to the gate of the protection transistor 5 until the potential VRC reaches a threshold of the inverters of the inverter circuit 4. As a result, the protection transistor 5 is on during time defined by the positive pulse, which transfers the ESD surge from the power supply wiring 2 to the reference voltage wiring 3. This protects an internal circuit that serves as a protected circuit coupled between the power supply wiring 2 and the reference voltage wiring 3, from the ESD surge.

When the potential VRC reaches the threshold of the inverters of the inverter circuit 4, the application of the positive pulse to the gate of the protection transistor 5 is terminated. This turns off the protection transistor 5 rapidly. The ESD protection circuit 100 detects the ESD surge with use of the detection circuit 8 that is configured of the RC series circuit in such a manner, thereby responding a detection result of the detection circuit 8 to rapidly remove the ESD surge from the power supply wiring 2.

It is necessary for the operation of the ESD protection circuit 100 to satisfy demands under the following situations (1) and (2).

(1) During Normal Operation (Without Surge Application)

Here, "during normal operation (without surge application)" indicates an operation state in which potential variation of the power supply wiring 2 is scheduled during the normal operation but the surge that is large enough to turn on the protection transistor 5 is not applied to the power supply wiring 2. The scheduled potential variation of the power supply wiring 2 indicates potential variation at start-up and shut-down of a power supply, and potential variation in which the potential of the power supply wiring 2 is fluctuated with a small amplitude caused by circuit operation.

When the power supply wiring 2 is retained at the power supply voltage VDD, the detection capacitor Ca is in a high impedance state. Therefore, the potential VRC of the node that couples the detection resistor Ra to the detection capacitor Ca becomes substantially H (VDD) level. The potential of the H level is applied to an input of a first inverter Inv1 that is a first stage of the three inverters, and an output of the first inverter Inv1 accordingly becomes L (VSS) level. The output (L level) of the first inverter Inv1 determines respective outputs of the second and third inverters Inv2 and Inv3. At this time, the output of the second inverter Inv2 become H level, and the output of the third inverter Inv3 becomes L level.

Accordingly, a channel of the protection transistor 5 is closed because the gate of the protection transistor 5 at this time is at the L (VSS) level. This prevents a current from flowing from the power supply wiring 2 supplied with the power supply voltage VDD to the reference voltage wiring 3 supplied with the reference voltage VSS.

(2) When an ESD Surge is Applied during Assembling Work

An ESD examination is typically performed in this situation. During assembling work, normally, only the reference voltage wiring 3 is often coupled to a reference potential (for example, a ground voltage) for electrostatic countermeasure. In contrast, the VDD terminal 2T to which the power supply wiring 2 is coupled is not wired. At this time, the gate potential of the protection transistor 5 is uncertain (for example, floating) because power is not supplied to each of the inverters.

When the ESD surge is suddenly applied to the VDD terminal 2T in this state, the inverter circuit 4 and the protection transistor 5 becomes operable for a short time with use of the ESD surge in place of the power supply voltage VDD. In this case, the protection transistor 5 is turned on for a short time even during the assembling work, which allows for ESD surge removal.

0.1.2 Configuration of Second Comparative Example

FIG. 3 illustrates a circuit of a second comparative example with respect to the semiconductor integrated circuit according to the present disclosure. The circuit of the second comparative example illustrated in FIG. 3 shows a configuration example of an ESD protection circuit 101 having an RCMOS configuration in which an off-leak current is reduced, based on description of PTL 1 described above.

In the ESD protection circuit 101 of FIG. 3, the inverter circuit 4 in the ESD protection circuit 100 of FIG. 1 is illustrated with a specific transistor configuration. As with the ESD protection circuit 100 of FIG. 1, the VDD terminal 2T and the VSS terminal 3T are provided as the external terminals also in the ESD protection circuit 101 of FIG. 3; however, the external terminals are omitted in illustration. In addition, in the circuit example of FIG. 3, a protected circuit 6 that is coupled to the power supply wiring 2 and the reference voltage wiring 3 and supplied with power, is provided. The ESD protection circuit 101 and the protected circuit 6 are integrated on one semiconductor substrate, which configures the semiconductor integrated circuit.

In the ESD protection circuit 101, each of the first, second, and third inverters Inv1, Inv2, and Inv3 of the inverter circuit 4 is configured of a PMOS transistor 4P and an NMOS transistor 4N that are coupled in series between the power supply wiring 2 and the reference voltage wiring 3. A gate common to the PMOS transistor 4P and the NMOS transistor 4N of the first inverter Inv1 in the first stage is coupled between the detection resistor Ra and the detection capacitor Ca. Further, a drain common to the PMOS transistor 4P and the NMOS transistor 4N of the first inverter Inv1 is coupled to an input end of the second inverter Inv2 in the next stage. The second and third inverters Inv2 and Inv3 each have a configuration substantially similar to the configuration of the first inverter Inv1. An output end of the third inverter Inv3 in the final stage is coupled to the gate terminal of the protection transistor 5.

In the ESD protection circuit 101, a source terminal of the NMOS transistor 4N of only the third inverter Inv3 in the final stage is coupled to a third power supply line 7 different from the reference voltage wiring 3.

The third power supply line 7 is wiring to supply a negative voltage (−VS), and may be coupled to an unillustrated external terminal (−VS terminal). Note that, when the protected circuit 6 is a circuit that uses the same negative voltage (−VS), the ESD protection circuit 101 may preferably share the third power supply line 7 with the protected circuit 6. In addition, when the negative voltage (−VS) is generated from, for example, the power supply voltage VDD in the semiconductor integrated circuit, the external terminal is unnecessary.

A leak current of the protection transistor 5 during the above-described normal operation (1) becomes an issue in the configuration of the ESD protection circuit 100 of FIG. 1. FIG. 2 is a characteristic graph of a gate voltage Vg versus a drain current Id of the typical NMOS transistor. When the gate voltage Vg of the protection transistor 5 is 0 V during the normal operation, the channel thereof is closed. A slight amount of current called an off-leak current, however, flows between the source and the drain of the protection transistor 5. For example, in the example of FIG. 2, the off-leak current of about 0.1 nA per unit gate width (1 μm) may be generated when the gate voltage Vg is 0 V. The protection transistor 5 typically has a size allowing a large amount of current to flow therethrough, and has a large gate width that is normally one mm or more, which causes large power consumption.

To reduce the off-leak current, the source terminal of the NMOS transistor 4N of only the third inverter Inv3 in the final stage is biased with the negative voltage (−VS) that is lower than the reference voltage VSS, in the ESD protection circuit 101 of FIG. 3.

In the ESD protection circuit 101, the voltage of the third power supply line 7 is set independently of the reference voltage wiring 3 during the above-described normal operation (without surge application) (1). This reduces the off-leak current of the protection transistor 5. For example, the negative voltage (−VS) is supplied to the third power supply line 7. In this case, the NMOS transistor 4N of the third inverter Inv3 in the final stage applies the negative voltage (−VS) to the gate of the protection transistor 5 during the operation of the third inverter Inv3. The off-leak current of the protection transistor 5 is reduced when the negative voltage (−VS) is applied, as compared with when the reference voltage VSS (normally, 0 V) is applied as with the ESD protection circuit 100 of FIG. 1.

0.2 Issues

As mentioned above, in the ESD protection circuit 101 of FIG. 3, the source side and a back gate of the NMOS transistor 4N of the third inverter Inv3 prior to the protection transistor 5 is set not to the reference voltage VSS but to the negative voltage (−VS). This causes the gate voltage of the protection transistor 5 to become negative during the above-described normal operation (without surge application) (1), which reduces the off-leak current of the protection transistor 5.

In the ESD protection circuit 101 of FIG. 3, however, it is necessary to set the back gate (a P well) of the NMOS transistor 4N of the inverter Inv3 to the negative voltage, in addition to the source of the NMOS transistor 4N. To set the back gate to the negative voltage, it is necessary to separate only a well of the NMOS transistor 4N of the inverter Inv3 from other MOS transistors. This is difficult in design and layout because a well using a power supply different from the other MOS transistors is necessary, as compared with the ESD protection circuit 100 of FIG. 1.

1. First Embodiment

Next, a first embodiment of the present disclosure is described. In the following, description of portions including configurations and operation similar to those of the circuits illustrated in FIG. 1 and FIG. 3 is appropriately omitted.

1.1 Configuration and Operation

FIG. 4 illustrates a configuration example of a semiconductor integrated circuit according to the first embodiment of the present disclosure.

In the circuit example of FIG. 4, the ESD protection circuit 1 and the protected circuit 6 are integrated in one semiconductor substrate, which configures a semiconductor integrated circuit. The semiconductor integrated circuit of FIG. 4 is coupled to the protected circuit 6, and includes the power supply wiring 2 and the reference voltage wiring 3 that supply the power supply voltage VDD to the protected circuit 6, as with the semiconductor integrated circuit of FIG. 3. In addition, the semiconductor integrated circuit of FIG. 4 includes the third power supply line 7 that is supplied with a voltage different from the voltage supplied to the power supply wiring 2 and the reference voltage wiring 3.

The ESD protection circuit 1 of FIG. 4 further includes the inverter circuit 4, the protection transistor 5, and the detection circuit 8 between the power supply wiring 2 and the reference voltage wiring 3, as with the circuit example of FIG. 1.

In the ESD protection circuit 1 of FIG. 4, the inverter circuit 4 in the ESD protection circuit 100 of FIG. 1 is illustrated with a specific transistor configuration, as with the circuit example of FIG. 3. The VDD terminal 2T and the VSS terminal 3T are provided as external terminals also in the ESD protection circuit 1 of FIG. 4, as with the ESD protection circuit 100 of FIG. 1; however, the external terminals are omitted in illustration.

An example in which the inverter circuit 4 is configured of one stage of only the first inverter Inv1 is illustrated in the ESD protection circuit 1 of FIG. 4; however, the inverter circuit 4 may have a two or more-stage configuration including two or more inverters, as with a modification described later. The first inverter Inv1 is configured of the PMOS transistor 4P and the NMOS transistor 4N that are coupled in series between the power supply wiring 2 and the reference voltage wiring 3.

The ESD protection circuit 1 of FIG. 4 further includes a time constant circuit 9, as a component different from that in the circuit examples of FIG. 1 and FIG. 3. The time constant circuit 9 is coupled to at least the third power supply line 7 and the protection transistor 5. The time constant circuit 9 may include a capacitor Cb and a resistor Rb that are coupled in series to each other. One end of the capacitor Cb may be coupled to an output end of the inverter circuit 4. One end of the resistor Rb may be coupled to the third power supply line 7. The other end of the capacitor Cb may be coupled to the gate terminal of the protection transistor 5 and the other end of the resistor Rb. The other end of the resistor Rb may be coupled to the other end of the capacitor Cb and the gate terminal of the protection transistor 5.

In the ESD protection circuit 1, the protection transistor 5 may be an NMOS transistor. The positive voltage as the power supply voltage VDD may be supplied to the power supply wiring 2, the ground voltage as the reference voltage VSS may be supplied to the reference voltage wiring 3, and the negative voltage (−VS) may be supplied to the third power supply line 7.

In the ESD protection circuit 1 of FIG. 4, the off-leak current of the protection transistor 5 is reduced during the above-described normal operation (without surge application) (1), as with the ESD protection circuit 101 of FIG. 3. Since the negative voltage (−VS) is supplied to the third power supply line 7, the potential of the gate of the protection transistor 5 becomes negative through the time constant circuit 9. Since the negative voltage that is lower than the reference voltage VSS is applied to the gate of the protection transistor 5, the off-leak current is reduced, as compared with the case in which the reference voltage VSS is applied to the gate of the protection transistor 5 as with the ESD protection circuit 100 of FIG. 1.

FIG. 5 is a characteristic graph of a gate voltage Vg versus a drain current Id of a typical NMOS transistor. As illustrated in FIG. 2 described above, the off-leak current of about 0.1 nA per unit gate width (1 μm) is generated in the protection transistor 5 even when the gate voltage Vg is 0 V. For example, as illustrated in FIG. 5, when the gate voltage Vg is −0.8 V, the off-leak current becomes lower by one digit or more than the off-leak current when the gate voltage Vg is 0 V.

In the ESD protection circuit 1 of FIG. 4, for example, the power supply voltage VDD and the negative voltage (−VS) may not be respectively supplied to the power supply wiring 2 and the third power supply line 7 when the ESD surge is applied during the above-described assembling work (2), and the gate potential of the protection transistor 5 may become uncertain (for example, floating). In this state, when the ESD surge is suddenly applied to the power supply wiring 2, the inverter circuit 4 and the protection transistor 5 become operable only for a short time, with use of the ESD surge in place of the power supply voltage VDD. The capacitor Cb allows the current to flow therethrough in response to the pulse input of the ESD surge and the gate of the protection transistor is turned on, which allows for ESD surge removal.

1.2 Effects

As mentioned above, the present embodiment makes it possible to reduce the off-leak current of the protection transistor 5, and to achieve low power consumption during the normal operation while maintaining the ESD protection function. For example, the present embodiment makes it possible to suppress the power consumption to 1/10 or less, as compared with the ESD protection circuit 100 of FIG. 1.

In addition, it is sufficient to perform wiring processing of simply adding the time constant circuit 9 to the ESD protection circuit 100 of FIG. 1 in the present embodiment, whereas it is necessary to separate only the well of the NMOS transistor 4N of the inverter Inv3 from the other MOS transistors in the ESD protection circuit 101 of FIG. 3. This does not cause an issue in design and layout.

Note that the effects described in the present specification are illustrative and non-limiting. Effects achieved by the technology may be effects other than those described above. The same applies to other embodiments and modifications described below.

1.3 Modifications

Next, modifications of the first embodiment are described. In the following, description of portions including configurations and operation similar to those of the circuits illustrated in FIG. 4 is appropriately omitted.

1.3.1 First and Second Modifications

In the semiconductor integrated circuit illustrated in FIG. 4, the inverter circuit 4 may be configured of two or more inverters.

FIG. 6 illustrates an example of a semiconductor integrated circuit according to a first modification of the first embodiment.

The semiconductor integrated circuit illustrated in FIG. 6 may include an ESD protection circuit 1A that includes the inverter circuit 4 having a three-stage configuration, relative to the semiconductor integrated circuit illustrated in FIG. 4. In other words, the inverter circuit 4 may have the configuration in which the first, second, and third inverters Inv1, Inv2, and Inv3 are coupled in series. In this case, the output end of the third inverter Inv3 in the final stage may serve as the output end of the inverter circuit 4. Therefore, the one end of the capacitor Cb in the time constant circuit 9 may be coupled to the output end of the third inverter Inv3.

Other configurations and operation may be substantially similar to those of the semiconductor integrated circuit illustrated in FIG. 4. In addition, the configurations except for the inverter circuit 4 may be substantially similar to those of the semiconductor integrated circuit illustrated in FIG. 4 when the inverter circuit 4 has the configuration of five or more odd-numbered stages.

FIG. 7 illustrates an example of a semiconductor integrated circuit according to a second modification of the first embodiment.

The semiconductor integrated circuit illustrated in FIG. 7 may include an ESD protection circuit 1B that includes the inverter circuit 4 having a two-stage configuration, relative to the semiconductor integrated circuit illustrated in FIG. 4. In other words, the inverter circuit 4 may have the configuration in which the first and second inverters Inv1 and Inv2 are coupled in series to each other. In this case, the output end of the second inverter Inv2 in the final stage may serve as the output end of the inverter circuit 4. Therefore, the one end of the capacitor Cb of the time constant circuit 9 may be coupled to the output end of the second inverter Inv2.

The semiconductor integrated circuit illustrated in FIG. 7 has positional relationship of the detection resistor Ra and the detection capacitor Ca that configure the detection circuit 8, inverted from the positional relationship of the semiconductor integrated circuit illustrated in FIG. 4. In other words, in the semiconductor integrated circuit illustrated in FIG. 4, one end of the detection resistor Ra is coupled to the power supply wiring 2, and one end of the detection capacitor Ca is coupled to the reference voltage wiring 3. In contrast, in the semiconductor integrated circuit illustrated in FIG. 7, one end of the detection capacitor Ca is coupled to the power supply wiring 2, and one end of the detection resistor Ra is coupled to the reference voltage wiring 3.

Other configurations and operation may be substantially similar to those of the semiconductor integrated circuit illustrated in FIG. 4. In addition, the configurations except for the inverter circuit 4 and the detection circuit 8 may be substantially similar to those of the semiconductor integrated circuit illustrated in FIG. 4 when the inverter circuit 4 has the configuration of four or more even-numbered stages.

1.3.2 Third Modification

FIG. 8 illustrates an example of a semiconductor integrated circuit according to a third modification of the first embodiment.

The semiconductor integrated circuit illustrated in FIG. 8 may include an ESD protection circuit 1C that includes the inverter circuit 4 having a two-stage configuration and a protection transistor 5P configured of a PMOS transistor, relative to the semiconductor integrated circuit illustrated in FIG. 4.

The inverter circuit 4 may have a configuration in which the first and second inverters Inv1 and Inv2 are coupled in series to each other. In this case, the output end of the second inverter Inv2 in the final stage may serve as the output end of the inverter circuit 4. Therefore, one end of the capacitor Cb in the time constant circuit 9 may be coupled to the output end of the second inverter Inv2.

In the ESD protection circuit 1C, a first positive voltage as the power supply voltage VDD may be supplied to the power supply wiring 2, the ground voltage as the reference voltage VSS may be supplied to the reference voltage wiring 3, and a second positive voltage VD that is higher than the first positive voltage may be supplied to the third power supply line 7.

The other configurations and operation may be substantially similar to those of the semiconductor integrated circuit illustrated in FIG. 4.

2. Second Embodiment

Next, a second embodiment of the present disclosure is described. In the following, description of portions including configurations and operation similar to those in the above-described first embodiment is appropriately omitted.

FIG. 9 illustrates an example of a semiconductor integrated circuit according to the second embodiment.

The semiconductor integrated circuit illustrated in FIG. 9 may include an ESD protection circuit 1D in which the connection position of the time constant circuit 9 is changed from the connection position of the time constant circuit 9 in the semiconductor integrated circuit illustrated in FIG. 4.

In the semiconductor integrated circuit illustrated in FIG. 4, the time constant circuit 9 may be coupled to the power supply wiring 2, the third power supply line 7, and the back gate terminal of the protection transistor 5. More specifically, the one end of the capacitor Cb of the time constant circuit 9 may be coupled to the power supply wiring 2. The one end of the resistor Rb may be coupled to the third power supply line 7. The other end of the capacitor Cb may be coupled to the back gate terminal of the protection transistor and the other end of the resistor Rb. The other end of the resistor Rb may be coupled to the other end of the capacitor Cb and the back gate terminal of the protection transistor 5.

Further, the output end of the inverter circuit 4 may be coupled to the gate terminal of the protection transistor 5. In the ESD protection circuit 1D, the protection transistor 5 may be the NMOS transistor. The positive voltage as the power supply voltage VDD may be supplied to the power supply wiring 2, the ground voltage as the reference voltage VSS may be supplied to the reference voltage wiring 3, and the negative voltage (−VS) may be supplied to the third power supply line 7. The other configurations may be substantially similar to those of the semiconductor integrated circuit illustrated in FIG. 4.

FIG. 10 is a characteristic graph of a gate voltage Vg versus a drain current Id of a typical NMOS transistor. As with the characteristic graph illustrated by "ref" in FIG. 10, the off-leak current of little less than about 0.1 nA per unit gate width (1 μm) is generated in the protection transistor 5 even when the gate voltage Vg is 0 V.

Even in the ESD protection circuit 1D of the present embodiment, the off-leak current of the protection transistor 5 is reduced during the above-described normal operation (without surge application) (1). Since the negative voltage (−VS) is supplied to the third power supply line 7, the negative voltage is applied to the back gate terminal of the protection transistor 5. This increases a threshold voltage Vth of the protection transistor 5. Therefore, the characteristic graph of the gate voltage Vg versus the drain current Id is entirely decreased and the off-leak-current is reduced, as illustrated in FIG. 10.

3. Other Embodiments

The technology of the present disclosure is not limited to the description of the above-described embodiments, and may be variously modified.

The present technology may have any of the following configurations, for example.

(1)

A semiconductor integrated circuit, including: a first power supply line and a second power supply line that are coupled to a protected circuit;

a third power supply line that is supplied with a voltage different from respective voltages supplied to the first power supply line and second power supply line;

a detection circuit that is coupled between the first power supply line and the second power supply line and detects a surge occurring in the first power supply line;

an inverter circuit that includes one or more inverters coupled in series, and is coupled between the first power supply line and the second power supply line;

a protection transistor that is coupled between the first power supply line and the second power supply line, and is controlled by an output of the detection circuit to cause the surge to flow through the second power supply line; and a time constant circuit that is coupled to at least the third power supply line and the protection transistor.

(2)

The semiconductor integrated circuit according to (1), wherein the time constant circuit includes a capacitor and a resistor, and the resistor has one end coupled to the third power supply line.

(3)

The semiconductor integrated circuit according to (2), wherein the capacitor has one end and the other end, the one end being coupled to an output end of the inverter circuit, and the other end being coupled to a gate terminal of the protection transistor and the other end of the resistor, and the other end of the resistor is coupled to the other end of the capacitor and the gate terminal of the protection transistor.

(4)

The semiconductor integrated circuit according to (2), wherein the capacitor has one end and the other end, the one end being coupled to the first power supply line, and the other end being coupled to a back gate terminal of the protection transistor and the other end of the resistor, and the other end of the resistor is coupled to the other end of the capacitor and the back gate terminal of the protection transistor.

(5)

The semiconductor integrated circuit according to any one of (1) to (4), wherein the protection transistor is an n-channel metal-oxide semiconductor transistor, the first power supply line is supplied with a positive voltage, the second power supply line is supplied with a ground voltage, and the third power supply line is supplied with a negative voltage.

(6)

The semiconductor integrated circuit according to any one of (1) to (4), wherein the protection transistor is a p-channel metal-oxide semiconductor transistor, the first power supply line is supplied with a first positive voltage, the second power supply line is supplied with a ground voltage, and the third power supply line is supplied with a second positive voltage that is higher than the first positive voltage.

This application is based upon and claims the benefit of priority of the Japanese Patent Application No. 2014-247067 filed in the Japan Patent Office on Dec. 5, 2014, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor integrated circuit, comprising:
a first power supply line and a second power supply line that are coupled to a protected circuit;
a third power supply line that is supplied with a voltage different from respective voltages supplied to the first power supply line and second power supply line;
a detection circuit that is coupled between the first power supply line and the second power supply line and detects a surge occurring in the first power supply line;
an inverter circuit that includes one or more inverters coupled in series, and is coupled between the first power supply line and the second power supply line;
a protection transistor that is coupled between the first power supply line and the second power supply line, and is controlled by an output of the detection circuit to cause the surge to flow through the second power supply line; and a time constant circuit that is coupled to at least the third power supply line and the protection transistor, wherein the time constant circuit includes a capacitor and a resistor, and the resistor includes a first end coupled to the third power supply line.

2. The semiconductor integrated circuit according to claim 1, wherein the capacitor includes a first end and a second end, the first end being coupled to an output end of the inverter circuit, and the second end being coupled to a gate terminal of the protection transistor and a second end of the resistor, and the second end of the resistor is coupled to the second end of the capacitor and the gate terminal of the protection transistor.

3. The semiconductor integrated circuit according to claim 1, wherein the capacitor includes a first end and a second end, the first end being coupled to the first power supply line, and the second end being coupled to a back gate terminal of the protection transistor and a second end of the resistor, and the second end of the resistor is coupled to the second end of the capacitor and the back gate terminal of the protection transistor.

4. A semiconductor integrated circuit, comprising:
a first power supply line and a second power supply line that are coupled to a protected circuit;
a third power supply line that is supplied with a voltage different from respective voltages supplied to the first power supply line and second power supply line;
a detection circuit that is coupled between the first power supply line and the second power supply line and detects a surge occurring in the first power supply line;
an inverter circuit that includes one or more inverters coupled in series, and is coupled between the first power supply line and the second power supply line;
a protection transistor that is coupled between the first power supply line and the second power supply line, and is controlled by an output of the detection circuit to cause the surge to flow through the second power supply line; and a time constant circuit that is coupled to at least the third power supply line and the protection transistor, wherein the protection transistor is an n-channel metal-oxide semiconductor transistor, the first power supply line is supplied with a positive voltage, the second power supply line is supplied with a ground voltage, and the third power supply line is supplied with a negative voltage.

5. A semiconductor integrated circuit, comprising:
a first power supply line and a second power supply line that are coupled to a protected circuit;
a third power supply line that is supplied with a voltage different from respective voltages supplied to the first power supply line and second power supply line;
a detection circuit that is coupled between the first power supply line and the second power supply line and detects a surge occurring in the first power supply line;
an inverter circuit that includes one or more inverters coupled in series, and is coupled between the first power supply line and the second power supply line;
a protection transistor that is coupled between the first power supply line and the second power supply line, and is controlled by an output of the detection circuit to cause the surge to flow through the second power supply line; and a time constant circuit that is coupled to at least the third power supply line and the protection transistor, wherein the protection transistor is a p-channel metal-oxide semiconductor transistor, the first power supply line is supplied with a first positive voltage, the second power supply line is supplied with a ground voltage, and the third power supply line is supplied with a second positive voltage that is higher than the first positive voltage.

6. The semiconductor integrated circuit according to claim 1, wherein a first voltage is supplied to the first power supply line, a second voltage is supplied to the second power supply line, and a third voltage is supplied to the third power supply line, wherein each of the first, second and third voltages is different from each other, and wherein the third voltage is lower than the first and second voltages.

* * * * *